United States Patent
Akbas et al.

(10) Patent No.: US 11,270,906 B2
(45) Date of Patent: Mar. 8, 2022

(54) BURLS WITH ALTERED SURFACE TOPOGRAPHY FOR HOLDING AN OBJECT IN LITHOGRAPHY APPLICATIONS

(71) Applicant: ASML HOLDING N.V., Veldhoven (NL)

(72) Inventors: Mehmet Ali Akbas, Cheshire, CT (US); David Hart Peterson, Milford, CT (US); Tammo Uitterdijk, Wilton, CT (US); Michael Perry, Thomaston, CT (US); Richard Bryan Lewis, Rye, NY (US); Iliya Sigal, Stamford, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 16/756,907

(22) PCT Filed: Oct. 4, 2018

(86) PCT No.: PCT/EP2018/076964
§ 371 (c)(1),
(2) Date: Apr. 17, 2020

(87) PCT Pub. No.: WO2019/081174
PCT Pub. Date: May 2, 2019

(65) Prior Publication Data
US 2021/0202293 A1    Jul. 1, 2021

Related U.S. Application Data

(60) Provisional application No. 62/578,126, filed on Oct. 27, 2017.

(51) Int. Cl.
*H01L 21/687* (2006.01)
*G03F 7/20* (2006.01)

(52) U.S. Cl.
CPC .......... *H01L 21/6875* (2013.01); *G03F 7/707* (2013.01); *G03F 7/70783* (2013.01)

(58) Field of Classification Search
CPC .. G03F 7/70691; G03F 7/70716; G03F 7/707; G03F 7/70783; H01L 21/6875
(Continued)

(56) References Cited

U.S. PATENT DOCUMENTS 6,307,620 B1  10/2001  Takabayashi et al.
10,236,203 B2 *  3/2019  Valefi ...................... G03F 7/707
(Continued)

FOREIGN PATENT DOCUMENTS

CN    101563653    10/2009
EP    1491953    12/2004
(Continued)

OTHER PUBLICATIONS

International Search Report and Written Opinion issued in corresponding PCT Patent Application No. PCT/EP2018/076964, dated Feb. 6, 2019.
(Continued)

*Primary Examiner* — Michelle M Iacoletti
(74) *Attorney, Agent, or Firm* — Pillsbury Winthrop Shaw Pittman LLP

(57) ABSTRACT

Various burl designs for holding an object in a lithographic apparatus are described. A lithographic apparatus includes an illumination system, a first support structure, a second support structure, and a projection system. The illumination system is designed to receive radiation and to direct the radiation towards a patterning device that forms patterned radiation. The first support structure is designed to support the patterning device on the first support structure. The second support structure has a plurality of burls and is designed to support the substrate on the plurality of burls. A
(Continued)

topography of a top surface of each of the plurality of burls is not substantially flat, such that a contact area between the substrate and each of the plurality of burls is reduced. The projection system is designed to receive the patterned radiation and to direct the patterned radiation towards the substrate.

19 Claims, 12 Drawing Sheets

(58) Field of Classification Search
USPC .................................. 355/30, 53, 72, 75, 77
See application file for complete search history.

(56) References Cited

U.S. PATENT DOCUMENTS

| | | | |
|---|---|---|---|
| 2002/0036373 A1* | 3/2002 | Kosakai | H01L 21/6875 269/21 |
| 2003/0090070 A1 | 5/2003 | Endou et al. | |
| 2004/0040665 A1 | 3/2004 | Mizuno et al. | |
| 2005/0061995 A1 | 3/2005 | Vink et al. | |
| 2005/0117141 A1 | 6/2005 | Ottens et al. | |
| 2006/0006340 A1 | 1/2006 | Compen | |
| 2007/0285647 A1* | 12/2007 | Kwan | H01L 21/68757 355/72 |
| 2008/0138504 A1 | 6/2008 | Williams | |
| 2008/0158538 A1* | 7/2008 | Puyt | H01L 21/6875 355/72 |
| 2009/0033889 A1* | 2/2009 | Bleeker | G03F 7/70925 355/30 |
| 2010/0214549 A1 | 8/2010 | Cadee et al. | |
| 2013/0094005 A1* | 4/2013 | Kunnen | G03F 7/707 355/30 |
| 2014/0118709 A1 | 5/2014 | Morohashi et al. | |
| 2015/0370178 A1* | 12/2015 | Klomp | H01L 21/6831 355/72 |
| 2018/0190534 A1* | 7/2018 | Poiesz | G03F 7/2002 |
| 2019/0067069 A1* | 2/2019 | Glasko | H01L 21/6833 |

FOREIGN PATENT DOCUMENTS

| | | | |
|---|---|---|---|
| EP | 1840657 | 10/2007 | |
| JP | H0691463 | 4/1994 | |
| JP | 9283605 | 10/1997 | |
| JP | H09283605 | 10/1997 | |
| JP | 2001341043 | 12/2001 | |
| JP | 2005079586 | 3/2005 | |
| JP | 2011510488 | 3/2011 | |
| JP | 2011082579 | 4/2011 | |
| JP | 2011199303 | 10/2011 | |
| WO | 2017001135 | 1/2017 | |
| WO | WO-2017071900 A1 * | 5/2017 | ............ G03F 7/707 |

OTHER PUBLICATIONS

Japanese Office Action issued in corresponding Japanese Patent Application No. 2020-519350, dated May 20, 2021.
Chinese Office Action issued in corresponding Chinese Patent Application No. 201880069695.5, dated Nov. 23, 2021.

* cited by examiner

BURLS WITH ALTERED SURFACE TOPOGRAPHY FOR HOLDING AN OBJECT IN LITHOGRAPHY APPLICATIONS

CROSS-REFERENCE TO RELATED APPLICATIONS

This application is the U.S. national phase entry of PCT Patent Application No. PCT/EP2018/076964, which was filed Oct. 4, 2018, which claims the benefit of priority of U.S. Provisional Patent Application No. 62/578,126, which was filed on Oct. 27, 2017, and which is incorporated herein in its entirety by reference.

FIELD

The present disclosure relates to burled features on a support structure in a lithographic apparatus, where the burled features are designed to reduce the contact resistance between an object and the support structure.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA, or by decreasing the value of $k_1$.

In order to shorten the exposure wavelength, and thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

The radiation generated by such sources will not, however, be only EUV radiation and the source may also emit at other wavelengths including infra-red (IR) radiation and deep ultra-violet (DUV) radiation. DUV radiation can be detrimental to the lithography system as it can result in a loss of contrast. Furthermore unwanted IR radiation can cause heat damage to components within the system. It is therefore known to use a spectral purity filter to increase the proportion of EUV in the transmitted radiation and to reduce or even eliminate unwanted non-EUV radiation such as DUV and IR radiation.

A lithographic apparatus using EUV radiation may require that the EUV radiation beam path, or at least substantial parts of it, must be kept in vacuum during a lithographic operation. In such vacuum regions of the lithographic apparatus, a support structure may be used to support an object, such as a patterning device and/or a substrate in the lithographic apparatus.

The interface between the support structure and the object is subject to wear at the contact points on either or both the support structure and the object. Furthermore, static friction and/or Van der Waals forces between the object and the support structure may cause local distortions in the object where the object sticks more strongly to the support structure. These distortions may cause overlay errors and other abnormal imaging effects during various stages of the lithography process.

SUMMARY

Accordingly, there is a need for achieving higher flatness of a substrate or patterning device supported on a wafer table or mask table, respectively. According to an embodiment, a lithographic apparatus includes an illumination system, a first support structure, a second support structure, and a projection system. The illumination system is designed to receive radiation and to direct the radiation towards a patterning device that forms patterned radiation. The first structure is designed to support the patterning device on the first support structure. The second support structure is has a plurality of burls and is designed to support the substrate on the plurality of burls. A topography of a top surface of each of the plurality of burls is not substantially flat, such that a contact area between the substrate and each of the plurality of burls is reduced. The projection system is designed to receive the patterned radiation and to direct the patterned radiation towards the substrate.

In another embodiment, a substrate support used within a lithographic apparatus includes a base structure a plurality of burls extending above a top surface of the base structure. The topography of a top surface of each of the plurality of burls is not substantially flat, such that a contact area between a substrate placed on the plurality of burls and each of the plurality of burls is reduced.

In yet another embodiment, a lithographic apparatus includes an illumination system, a first support structure, a second support structure, and a projection system. The illumination system is designed to receive radiation and to direct the radiation towards a patterning device that forms patterned radiation. The first support structure is designed to support the patterning device. The second support structure is designed to support a substrate. The projection system is designed to receive the patterned radiation and to direct the patterned radiation towards the substrate. One or both of the first support structure and the second support structure includes a plurality of burls, wherein a topography of a top surface of each of the plurality of burls is not substantially flat.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
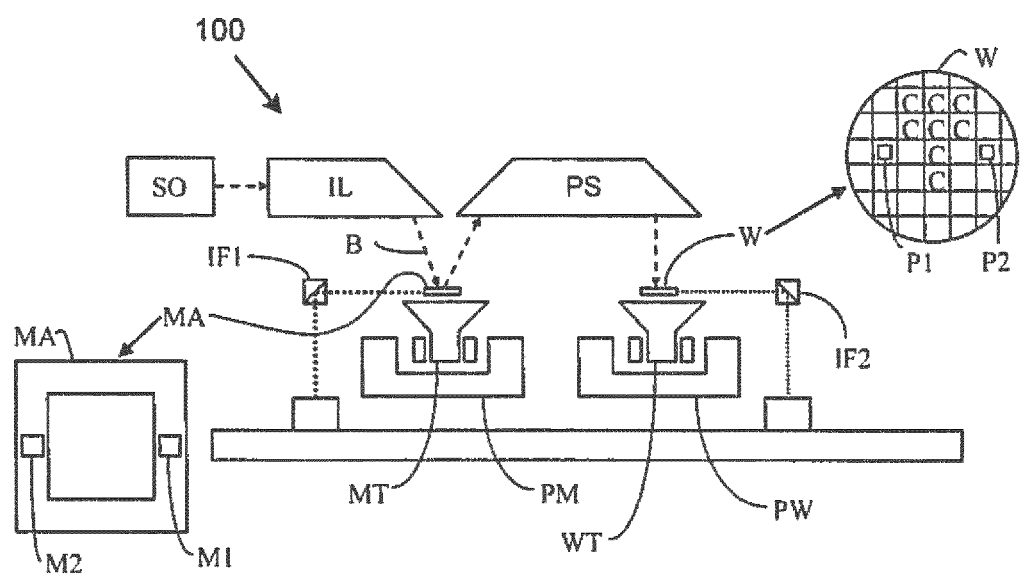
FIG. 1A is a schematic illustration of a reflective lithographic apparatus according to an embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1B:
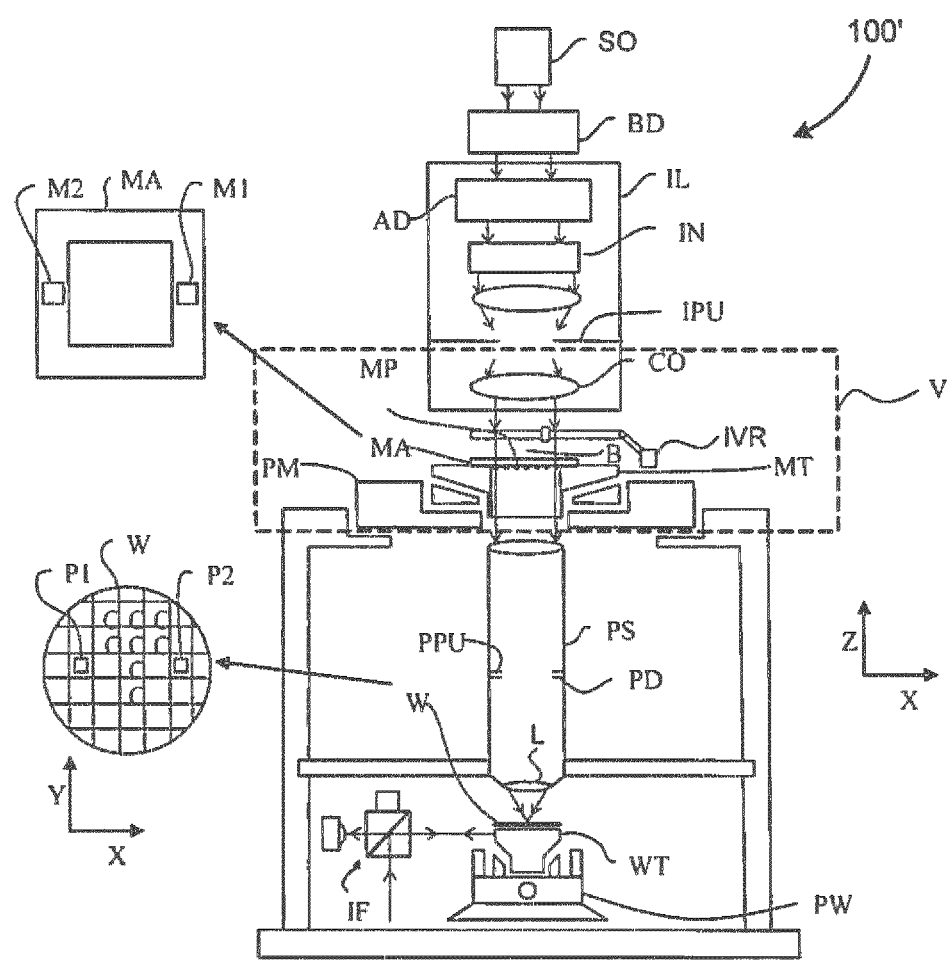
FIG. 1B is a schematic illustration of a transmissive lithographic apparatus according to an embodiment.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'— for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
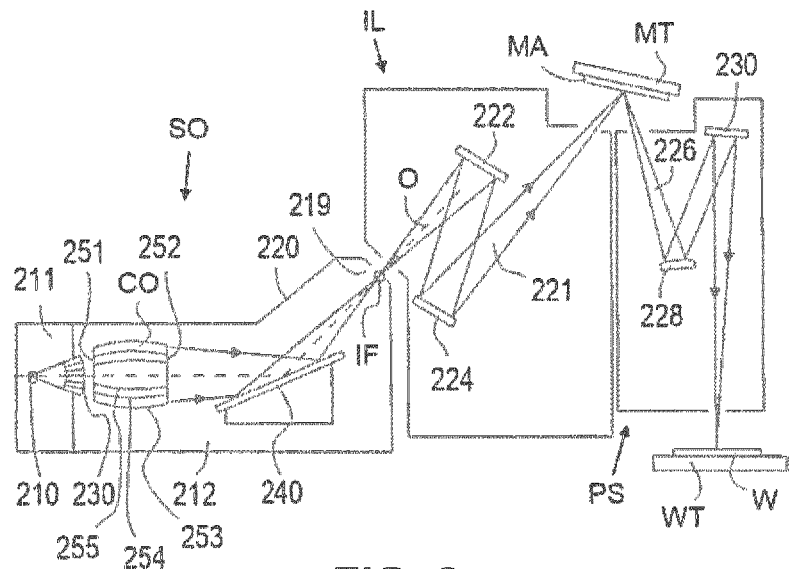
FIG. 2 is a more detailed schematic illustration of the reflective lithographic apparatus, according to an embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIGs., for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Example Lithographic Cell

Figure 3:
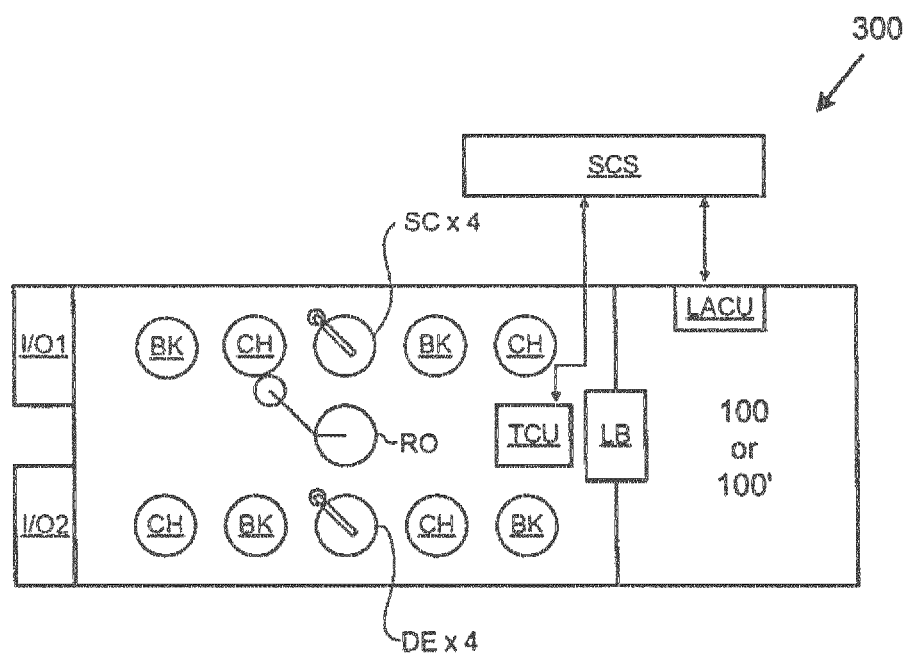
FIG. 3 is a schematic illustration of a lithographic cell, according to an embodiment.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Example Support Structure

Figure 4:
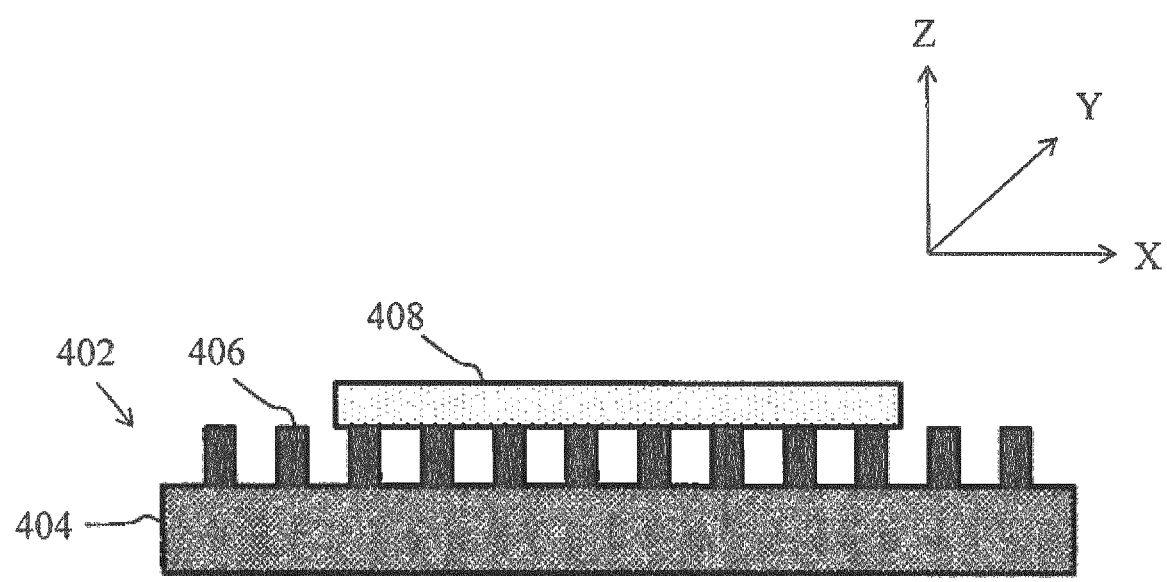
FIG. 4 is a schematic illustration of a structure supporting an object, according to an embodiment.

FIG. 4 illustrates an example support structure 402, according to an embodiment. Support structure 402 may be any type of supporting structure used within a lithographic apparatus to support an object 408 placed within the lithographic apparatus. For example, support structure 402 may be an electrostatic or vacuum clamp designed to hold object 408, where object 408 is a patterning device (sometimes referred to as a reticle). In another example, support structure 402 may be a wafer table designed to hold one or more of object 408, where object 408 is a wafer, such as a silicon wafer.

Support structure 402 includes a base structure 404 and a plurality of burls 406 extending above base structure 404. Burls 406 may be made from silicon/silicon carbide (Si/SiC), or any known ceramic or glass material. Burls 406 may have a circular cross-section along an X-Y plane, however, other cross-section shapes are possible as well without departing from the scope or spirit of the invention. Burls 406 may be arranged across base structure 404 having a pitch between about 2 mm and about 3 mm between each of the burls. Each of burls 406 may have a diameter between about 200 μm and about 500 μm with a total height between about 10 μm to about 150 μm.

Object 408 contacts the top of burls 406 and may be pulled against burls 406 by either an applied vacuum pressure or an applied electrostatic force. Accordingly, the surface topography of the top surface of burls 406 dictates the contact surface area between object 408 and support structure 402. If burls 406 have a substantially flat top surface topography, object 408 may stick too strongly to burls 406 via Van der Waals forces, which may be roughly quantified by the measured coefficient of static friction. In one example, a substantially flat surface is a surface having less than 10 nm roughness (Ra). The sticking of object 408 to burls 406 can cause local distortions in the flatness of object 408, leading to errors when performing lithography operations. According to an embodiment, the top surface topography of burls 406 is controllably altered to reduce the contact surface area by at least 75%, at least 50%, or at least 25%. In a typical lithographic apparatus that includes both a substrate support structure and a patterning device support structure, each of the support structures may include burls having a top surface topography that reduces the contact surface area by at least 75%, at least 50%, or at least 25%.

According to an embodiment, alteration to the top surface topography of burls 406 is performed to reduce slip of object 408 after it has been clamped to support structure 402. For example, if the top surface topography of burls 406 is rounded, the pressure of clamping object 408 will slightly deform object 408 around the top surface of burls 406, providing greater resistance to slipping of object 408 during a lithography process. In an embodiment, when removing object 408 from burls 406, object 408 elastically returns to its original shape.

Example Burl Designs

Figure 5A:
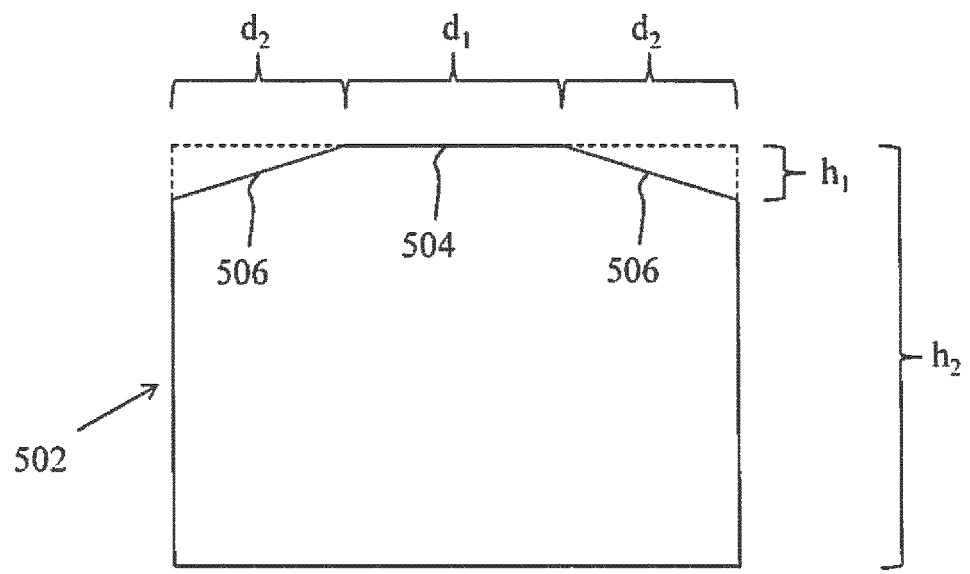
FIGS. 5A and 5B are illustrations of different views of a burl, according to an embodiment.
Figure 5B:
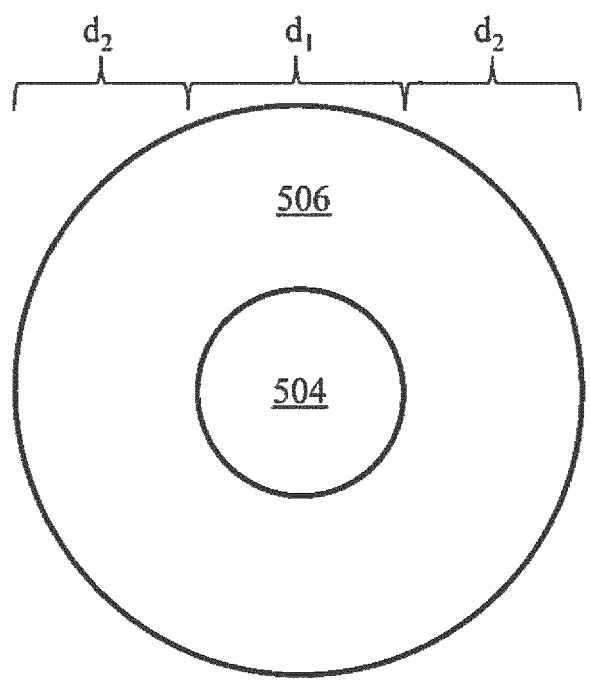

FIGS. 5A and 5B illustrate a side view and a top-down view, respectively, of a burl 502 designed to decrease the contact surface area on its top surface, according to an embodiment. The top surface of burl 502 includes a central portion 504 surrounded by a sloped portion 506 radiating from central portion 504 to the outer edge of burl 502.

The dotted lines in FIG. 5A illustrate the original flat-topped surface topography of burl 502 before the formation sloped surfaces 506. The formation of sloped surfaces 506 reduces the contact surface area on the top surface to only the area of central portion 504, according to an embodiment. Thus the contact area on the top of burl 502 is reduced by at least 75%, at least 50%, or at least 25% compared to the original flat-top topography.

According to an embodiment, a diameter di of central portion 504 is between about 1 μm and about 200 μm. According to an embodiment, sloped portion 506 extends in a radial direction from central portion 504 at a distance between 75 μm and 175 μm. Sloped portion 506 may have a height $h_1$ between about 50 nm and about 1000 nm. A total height $h_2$ of burl 502 may be between about 10 μm and about 150 μm.

Sloped portion 506 may be formed using a laser ablation technique, where a laser makes one or more passes across the top surface of burl 502 to etch away material on each pass. In an example, laser ablation proceeds as a set of concentric rings radiating out from the edge of central portion 504 to the outer edge of burl 502. The laser ablation ring may increase at about 20 μm increments as it moves outwards towards the outer edge of burl 502. The scanning speed of the laser may incrementally decrease as it moves towards the outer edge of burl 502. According to an embodiment, one laser ablation pass across the surface of burl 502 forms sloped portion 506 having a height of around 100 nm. After ten laser ablation passes across the surface of burl 502, sloped portion 506 may have a height of around 1 μm. Center portion 504 may be considered a substantially flat portion of the top surface of burl 502 because it is not ablated when forming sloped portions 506.

Figure 6:
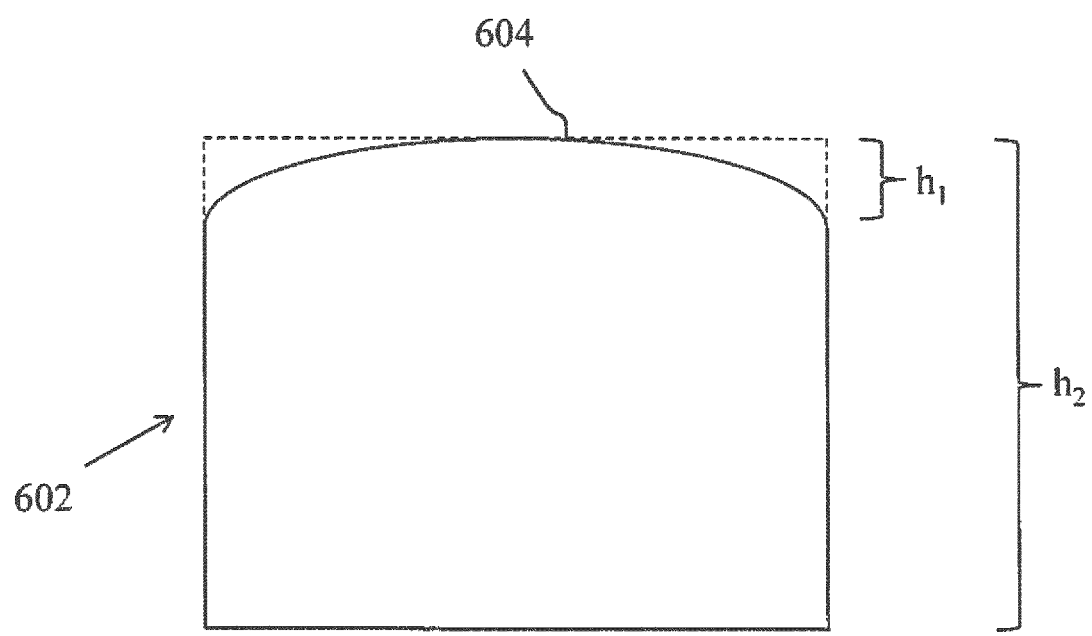
FIG. 6 is an illustration of a burl, according to an embodiment.

FIG. 6 illustrates a side view of a burl 602 designed to decrease the contact surface area on its top surface, according to another embodiment. Burl 602 has a top surface 604 with a rounded topography. The dotted lines in FIG. 6 illustrate the original flat-topped surface topography of burl 602 before the formation of the rounded surface 604. Formation of rounded surface 604 reduces the contact area by at least 75%, at least 50%, or at least 25% compared to the original flat-top topography.

According to an embodiment, a height $h_1$ of rounded surface 604 is between about 50 nm and about 1000 nm. A total height $h_2$ of burl 602 may be between about 10 μm and about 150 μm. Rounded surface 604 may have a radius of curvature between about 0.015 m and about 0.305 m.

In an embodiment, the top surface topography of burl 602 is laser ablated to form a topography similar to that of burl 502 illustrated in FIG. 5A. After the laser ablation, the top surface is further polished to smooth over the rough edges and form rounded surface 604. In another embodiment, the top surface topography of burl 602 is polished to form rounded surface 604 without any prior laser ablation of the surface. The polishing may be performed using known industry techniques such as pitch polishing, carpet polishing, water jet polishing, and precision bead blasting, to name a few examples.

Figure 7A:
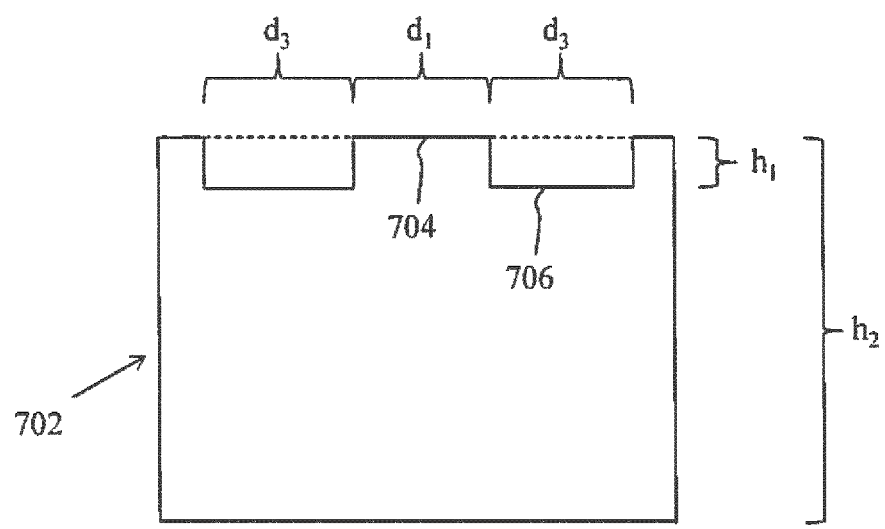
FIGS. 7A-7C are illustrations of different views of a burl, according to an embodiment.
Figure 7B:
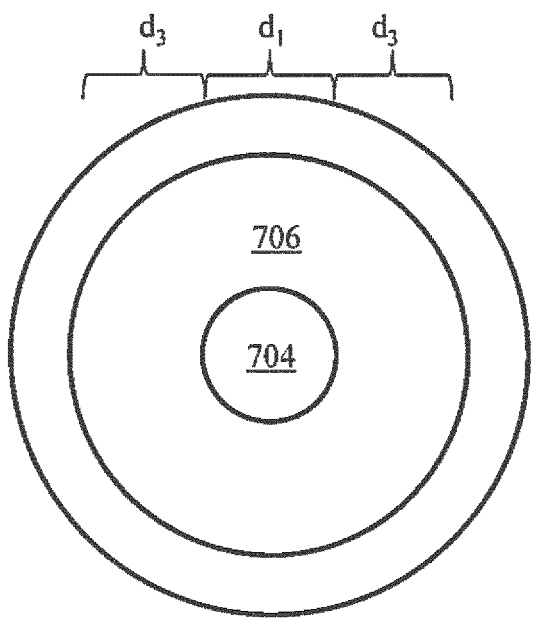
Figure 7C:
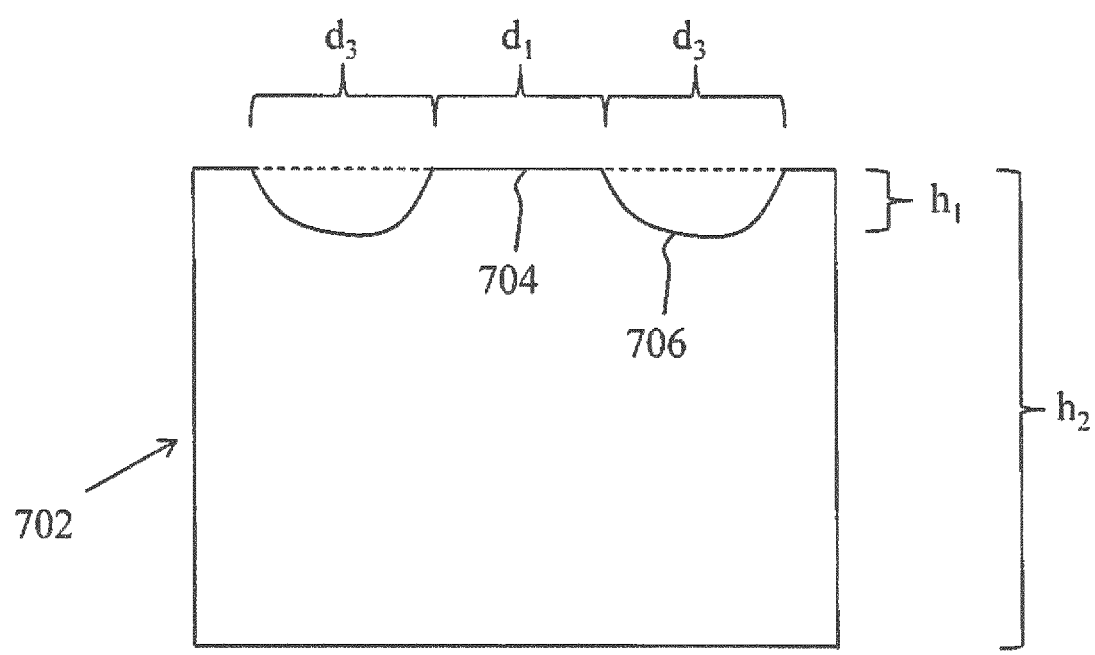

FIGS. 7A and 7B illustrate a side view and a top-down view, respectively, of a burl 702 designed to decrease the contact surface area on its top surface, according to another embodiment. The top surface of burl 702 includes a central island 704 surrounded by an ablated portion 706 radiating from central island 704, but not extending all the way to the outer edge of burl 702. Central island 704 may be defined as any portion of the top surface of burl 702 that is not ablated, but is surrounded by ablated portion 706. This may form a recessed "donut" shape in the top surface of burl 702. The dotted lines in FIG. 7A illustrate the original flat-topped surface topography of burl 702 before the formation of ablated portion 706. Formation of ablated portion 706 reduces the contact area by at least 75%, at least 50%, or at least 25% compared to the original flat-top topography. FIG. 7C illustrates a side view of burl 702 having rounded ablated portions 706 to generate a smoother transition from central island 704 to the outer edge of burl 702, according to an embodiment.

According to an embodiment, a diameter di of central island 704 is between about 1 μm and about 200 μm. According to an embodiment, ablated portion 706 extends in a radial direction from central island 704 at a distance between about 50 μm and about 150 μm. Ablated portion 706 may have a height $h_1$ between about 50 nm and about 1000 nm. A total height $h_2$ of burl 702 may be between about 10 μm and about 150 μm.

The top surface topography of burl 702 may provide a better contact profile for removal of an object from the top surface of burl 702. When an object is removed from a burl, it may wear the top surface of the burl over time which can increase the contact area and cause the sticking problems discussed above. By including a lip around the circumference of burl 702, the wear on the contacted surfaces is reduced when removing an object placed on the top surface.

Figure 8:
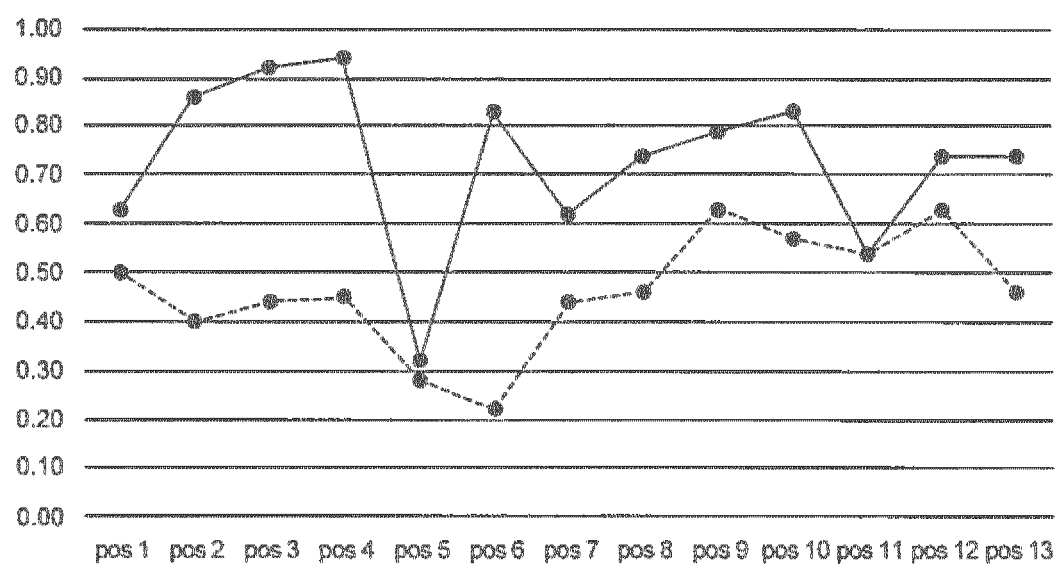
FIG. 8 is a graph of data illustrating the coefficient of static friction between substrates and a substrate support before and after the burls had their surface topography changed, according to an embodiment.

FIG. 8 illustrates a graph of data comparing the measured coefficient of static friction (COF) for a substrate placed at 13 different locations around a wafer table, according to an embodiment. The COF was measured at each different location before ablating the top surface topography of the burls (the solid line) and after ablating the top surface topography of the burls (the dashed line, as illustrated in FIGS. 5A and 5B.) As can be seen from the data, the COF decreases at almost every location after the burls have been ablated.

Burl Arrangement

Figure 9:
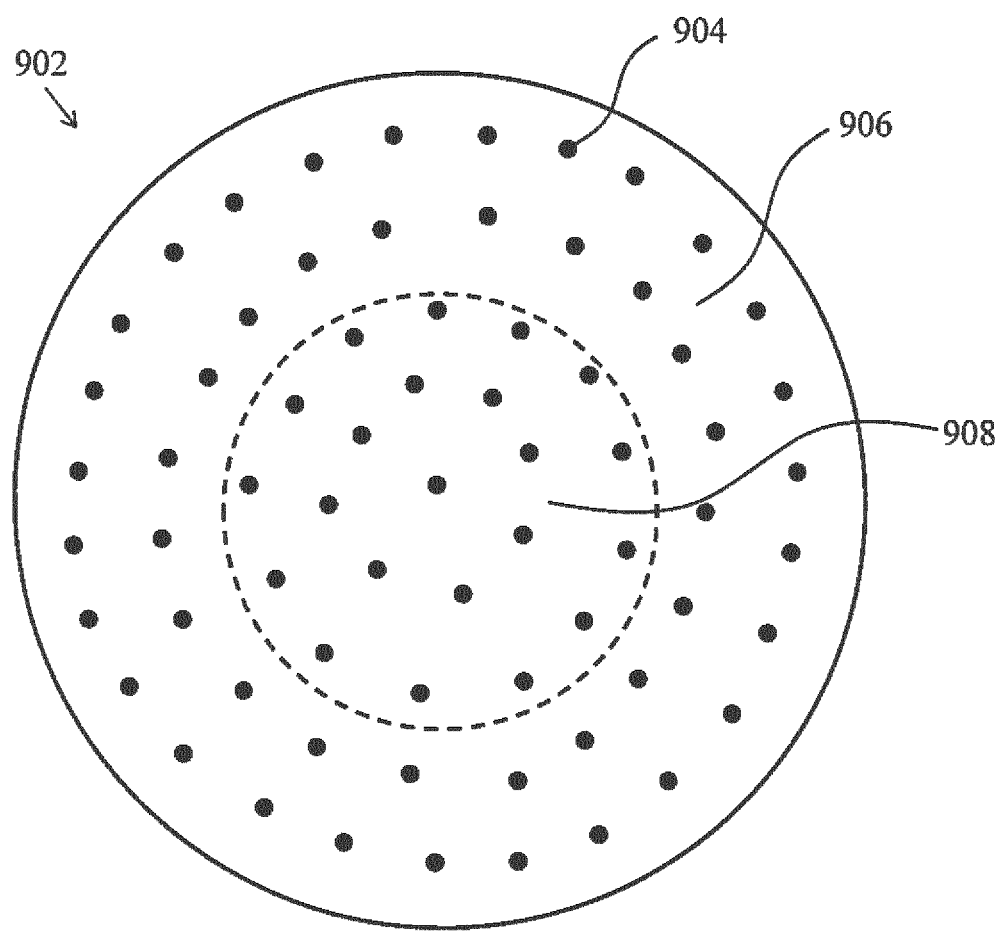
FIG. 9 is an illustration of a plurality of burls across a support structure, according to an embodiment.

FIG. 9 illustrates a top-down view of an example support structure 902, according to an embodiment. Support structure 902 may be a wafer table designed to support one or more substrates in a lithographic apparatus, or support structure 902 may be a mask table or chuck designed to support a patterning device (e.g., a reticle) in a lithographic apparatus. Although support structure 902 is illustrated as having a round cross-section, this is not required and it should be understood that support structure 902 may have any cross-sectional shape, including square, rectangular, or hexagonal.

According to an embodiment, support structure 902 includes a plurality of burls 904 arranged across the top surface of support structure 902. Each of the plurality of burls 904 may have a top surface topography that is altered to reduce the contact surface area with a supported object. The top surface topography of any of burls 904 may be altered as discussed with reference to any of the embodiments illustrated in FIGS. 5-7.

According to an embodiment, burls within different regions of support structure 902 may be ablated and/or polished to have a different top surface topography than the burls of other regions of support structure 902. In one example, a first region 906 may include burls having a top surface topography similar to that illustrated in FIG. 5A, while a second region 908 includes burls having a top surface topography similar to that illustrated in FIG. 7A. It should be understood that any of the described top surface topography embodiments may be used for the burls within different regions of support structure 902.

The different regions of support structure 902 are not limited to the illustrated circular regions. Support structure 902 may include any number of different regions having different sizes and shapes, where each region includes at least one burl. Each of the different regions may be distinguished from neighbouring regions by having burls with a different top surface topography than that of the burls of the neighbouring regions.

Figure 10:
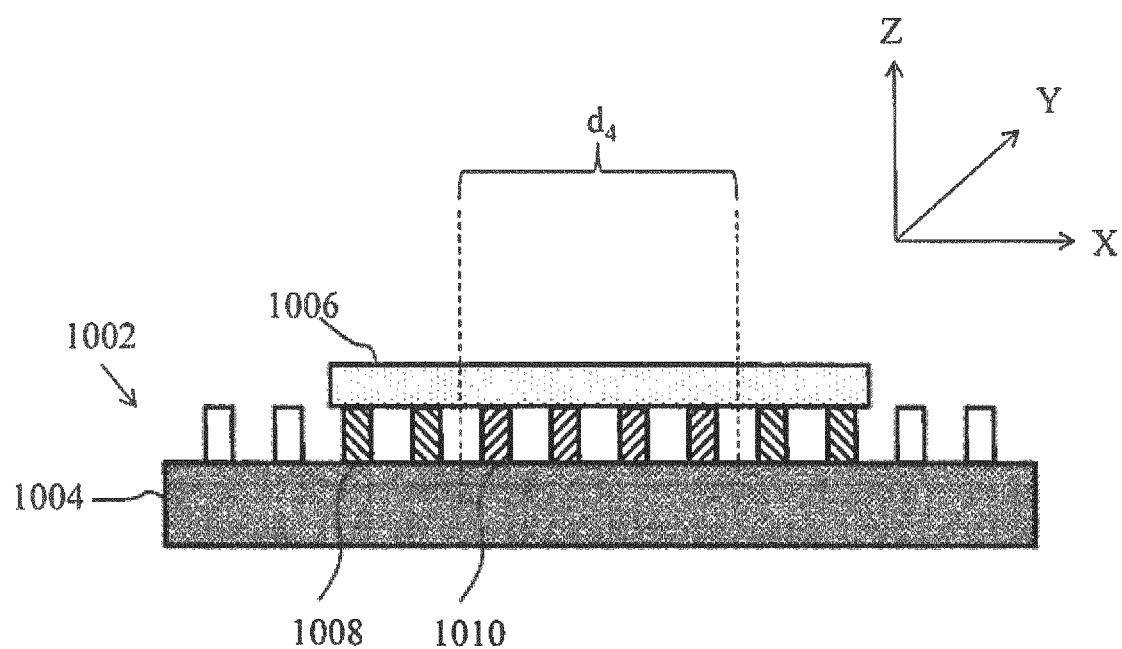
FIG. 10 is a schematic illustration of a structure supporting an object using different burl designs, according to an embodiment.

FIG. 10 illustrates a side view of another support structure 1002 having a base structure 1004 with a plurality of burls supporting an object 1006. The burls of support structure 1002 may be designed such that object 1006 rests upon burls having different top surface topographies, according to an embodiment.

In one example, a first plurality of burls 1008 in a first region around an outer portion of object 1006 have a first top surface topography and a second plurality of burls 1010 in a second region around in inner portion of object 1006 as a second top surface topography. The first top surface topography may be similar to the top surface topography illustrated in FIG. 7A while the second top surface topography may be similar to the top surface topography illustrated in FIG. 5A or in FIG. 6. The second region may have a diameter $d_4$ that is about 10%, 20%, 30%, 40%, 50%, 60%, 70%, 80%, or 90% of the full diameter of object 1006.

Fabrication Method

Figure 11:
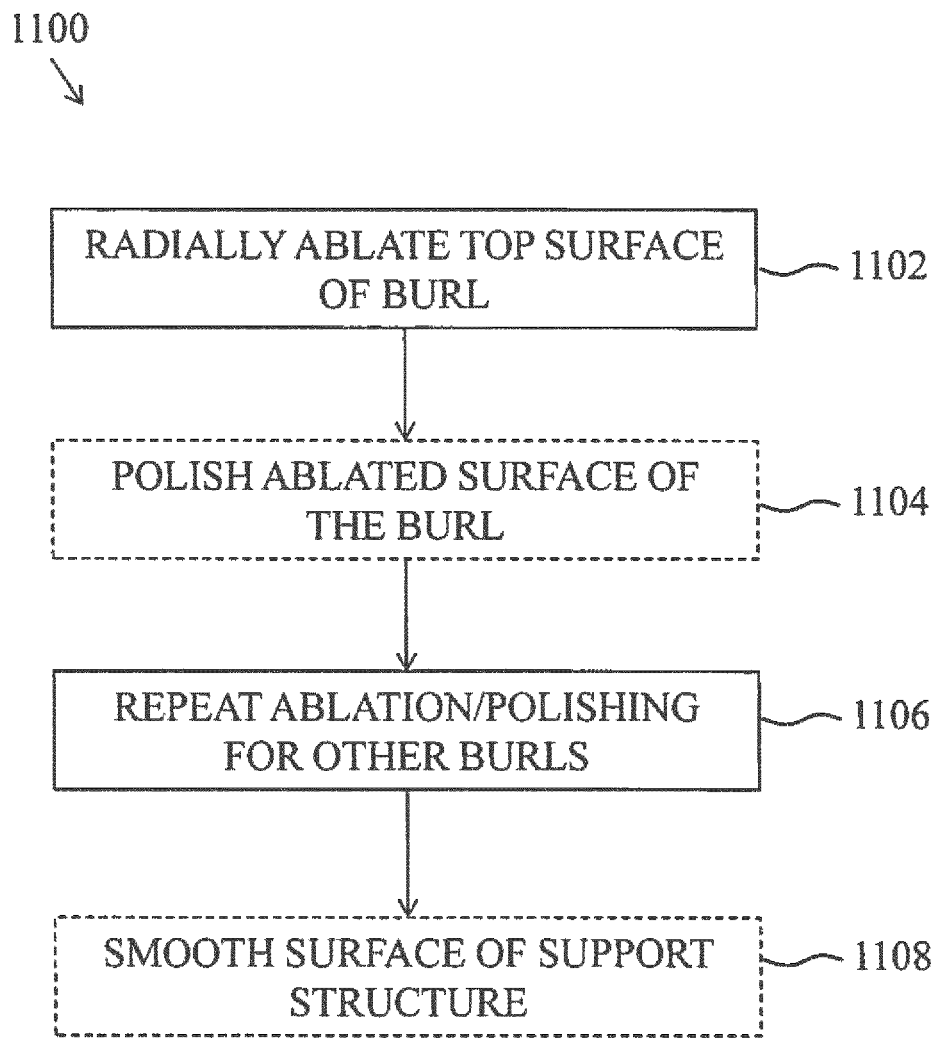
FIG. 11 is an example method of fabricating burls, according to an embodiment.

FIG. 11 illustrates an example method 1100 for fabricating a burl having an altered top surface topography that reduces the contact surface area of the top surface, according to an embodiment. Method 1100 may be performed to produce the top surface topography illustrated in FIG. 5A or in FIG. 6, as some examples.

Method 1100 begins at block 1102 where the top surface of a burl is ablated using a laser, according to an embodiment. The laser ablates material on the top surface of the burl concentrically in a radial direction from a center portion of the burl outwards towards an outer edge of the burl. The speed of the laser may decrease as it moves further outwards from the center portion.

The laser used for the ablation may be an infrared laser having a wavelength greater than about 800 nm. In other examples, the laser used for the ablation may have visible light wavelengths or wavelengths in the ultraviolet range. More than one pass may be made with the laser across the top surface of the burl to ablate more material with each pass. In one example, each pass with the laser decreases the height of the ablated portion by around 100 nm.

At block 1104, an optional step may be performed of polishing the top surface of the burl to further smooth over any edges, according to an embodiment. The polishing may be performed using any number of well-known techniques such as pitch polishing, carpet polishing, water jet polishing, and precision bead blasting, to name a few examples. Polishing may further reduce the contact surface area between the burl and an object supported on the top surface of the burl.

At block 1106, the ablation described in block 1102 is repeated for one or more other burls on a support structure, according to an embodiment. In another example, the ablation and/or polishing steps of blocks 1102 and 1104 are repeated for one or more other burls on the support structure. A support structure may include any number of burls.

In an example, an immersion wafer table having a diameter of 300 mm may have over 11,000 burls. The process of ablating each of the burls of the example immersion wafer table may be performed in less than two hours.

At block 1108, an optional step is performed to smooth the surface of the support structure, according to an embodiment. In some instances, the ablation and/or polishing process of each of the burls may affect the flatness of the top surface of the support structure. The support structure may thus be etched to improve the flatness using techniques such as ion beam figuring to remove excess material from the surface of the support structure.

It should be understood that the process of ablating and/or polishing various burls on a support structure does not need to be performed on a newly fabricated support structure. In some examples, a used support structure with worn burls may be refurbished using the described method 1100 to reduce the contact surface area between the burls and an object supported on the burls. In this way, support structures such as wafer tables and reticle clamps may be reused after their burls have become too worn through repeated use.

The embodiments may further be described using the following clauses:

1. A lithographic apparatus, comprising:
 an illumination system configured to receive radiation and to direct the radiation towards a patterning device configured to form patterned radiation;
 a first support structure configured to support the patterning device on the first support structure;
 a second support structure having a plurality of burls and configured to support a substrate on the plurality of burls, wherein a topography of a top surface of each of the plurality of burls is such that a contact area between the substrate and each of the plurality of burls is reduced by at least 50%; and
 a projection system configured to receive the patterned radiation and to direct the patterned radiation towards the substrate.

2. The lithographic apparatus of clause 1, wherein one or more of the plurality of burls has a top surface topography that includes a central substantially flat portion surrounded by a sloped portion.

3. The lithographic apparatus of clause 2, wherein the central substantially flat portion has a diameter between 1 μm and 200 μm.

4. The lithographic apparatus of clause 2, wherein the sloped portion extends in a radial direction from the central substantially flat portion at a distance between 75 μm and 175 μm.

5. The lithographic apparatus of clause 4, wherein the sloped portion has a height between 50 nm and 1000 nm.

6. The lithographic apparatus of clause 1, wherein one or more of the plurality of burls has a top surface topography that includes a rounded surface.

7. The lithographic apparatus of clause 1, wherein one or more of the plurality of burls has a top surface topography that includes a central non-ablated portion surrounded by an ablated portion that extends radially from the central non-ablated portion.

8. A substrate support configured for use within a lithographic apparatus, the substrate support comprising:
 a base structure; and
 a plurality of burls extending above a top surface of the base structure, wherein a topography of a top surface of each of the plurality of burls reduces a contact area between a substrate placed on the plurality of burls and each of the plurality of burls by at least 50%.

9. The substrate support of clause 8, wherein one or more of the plurality of burls has a top surface topography that includes a central substantially flat portion surrounded by a sloped portion.

10. The substrate support of clause 9, wherein the central substantially flat portion has a diameter between 1 μm and 200 μm.

11. The substrate support of clause 9, wherein the sloped portion extends in a radial direction from the central substantially flat portion at a distance between 75 μm and 175 μm.

12. The substrate support of clause 11, wherein the sloped portion has a height between 50 nm and 1000 nm.

13. The substrate support of clause 8, wherein one or more of the plurality of burls has a top surface topography that includes a rounded surface.

14. The substrate support of clause 8, wherein one or more of the plurality of burls has a top surface topography that includes a central non-ablated portion surrounded by an ablated portion that extends radially from the central non-ablated portion.

15. A lithographic apparatus, comprising:
 an illumination system configured to receive radiation and to direct the radiation towards a patterning device configured to form patterned radiation;
 a first support structure configured to support the patterning device on the first support structure;
 a second support structure configured to support the substrate; and
 a projection system configured to receive the patterned radiation and to direct the patterned radiation towards the substrate,
 wherein one or both of the first support structure and the second support structure includes a plurality of burls, wherein a topography of a top surface of each of the plurality of burls is such that a contact area between the patterning device and each of the plurality of burls on the first support structure and between the substrate and each of the plurality of burls on the second support structure is reduced by at least 50%.

16. The lithographic apparatus of clause 15, wherein one or more of the plurality of burls has a top surface topography that includes a central substantially flat portion surrounded by a sloped portion.

17. The lithographic apparatus of clause 16, wherein the central substantially flat portion has a diameter between 1 μm and 200 μm.

18. The lithographic apparatus of clause 16, wherein the sloped portion extends in a radial direction from the central substantially flat portion at a distance between 75 μm and 175 μm.

19. The lithographic apparatus of clause 18, wherein the sloped portion has a height between 50 nm and 1000 nm.

20. The lithographic apparatus of clause 15, wherein one or more of the plurality of burls has a top surface topography that includes a rounded surface.

FINAL REMARKS

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation," "beam," and "light" used herein encompass all types of electromagnetic radiation, including ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, Mine 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

What is claimed is:

1. A support structure having a plurality of burls and configured to support a substrate or a patterning device on the plurality of burls,
    wherein a topography of a top surface of each of the plurality of burls is such that a contact area between the substrate or patterning device and each of the plurality of burls is reduced by at least 50% compared to a contact area of a flat topography at least when the substrate or patterning device is an unclamped state on the support structure, and
    wherein one or more of the plurality of burls has a top surface topography that comprises a central protruding portion surrounded by a recess portion and the central protruding portion and the recess portion are surrounded by peripheral protruding portion.

2. The support structure of claim 1, wherein the central protruding portion includes a central substantially flat portion surrounded by a sloped portion.

3. The support structure of claim 1, wherein the central protruding portion has a cross-sectional dimension between 1 µm and 200 µm.

4. The support structure of claim 2, wherein the sloped portion extends in a radial direction from the central substantially flat portion at a distance between 75 µm and 175 µm.

5. The support structure of claim 4, wherein the sloped portion has a height between 50 nm and 1000 nm.

6. The support structure of claim 1, wherein one or more of the plurality of burls has a top surface topography that includes a central non-ablated portion surrounded by an ablated portion that extends radially from the central non-ablated portion.

7. A support configured for use within a lithographic apparatus, the support comprising:
a base structure; and
a plurality of burls extending above a top surface of the base structure,
wherein a topography of a top surface of each of the plurality of burls reduces a contact area between a substrate or patterning device placed on the plurality of burls and each of the plurality of burls by at least 50% compared to a contact area of a flat topography at least when the substrate or patterning device is an unclamped state on the support structure, and
wherein one or more of the plurality of burls has a top surface topography that includes a central substantially flat portion surrounded by a sloped portion,
wherein the sloped portion extends in a radial direction from the central substantially flat portion at a distance between 75 µm and 175 µm.

8. The support of claim 7, wherein the central substantially flat portion has a cross-sectional dimension between 1 µm and 200 µm.

9. The support of claim 7, wherein the sloped portion has a height between 50 nm and 1000 nm.

10. The support of claim 7, wherein one or more of the plurality of burls has a top surface topography that includes a rounded surface.

11. The support of claim 7, wherein one or more of the plurality of burls has a top surface topography that includes a central non-ablated portion surrounded by an ablated portion that extends radially from the central non-ablated portion.

12. A support structure configured to support a substrate or a patterning device, the support structure includes a plurality of burls,
wherein a topography of a top surface of each of the plurality of burls is such that a contact area between the substrate or patterning device and each of the plurality of burls on the support structure is reduced by at least 50% compared to a contact area of a flat topography at least when the substrate or patterning device is an unclamped state on the support structure, and
wherein one or more of the plurality of burls has a top surface topography that comprises a convex rounded surface facing toward the substrate or patterning device and extending from a central portion of each respective top surface to the periphery of the respective top surface,
wherein the rounded surface has a radius of curvature between about 0.015 m and about 0.305 m.

13. The support structure of claim 12, wherein the height of the rounded surface is between about 50 nm and about 1000 nm.

14. The support structure of claim 12, wherein each of the burls have a total height between about 10 µm and about 150 µm.

15. The support structure of claim 12, wherein one or more burls of the plurality of burls has a different top surface topography design than one or more other burls of the plurality of burls.

16. The support structure of claim 12, wherein a first plurality of burls of the plurality of burls has a first top surface topography design and a second plurality of burls of the plurality of burls has a second different top surface topography design, the first plurality surrounding the second plurality.

17. A lithographic apparatus, comprising:
the support structure of claim 12 configured to hold a patterning device or substrate in the lithographic apparatus; and
a projection system configured to receive a patterned radiation and to direct the patterned radiation towards a substrate.

18. A lithographic apparatus, comprising:
the support structure of claim 1 configured to hold a patterning device or substrate in the lithographic apparatus; and
a projection system configured to receive a patterned radiation and to direct the patterned radiation towards a substrate.

19. A lithographic apparatus, comprising:
the support structure of claim 7 configured to hold a patterning device or substrate in the lithographic apparatus; and
a projection system configured to receive a patterned radiation and to direct the patterned radiation towards a substrate.

* * * * *